(12) United States Patent
Chen et al.

(10) Patent No.: US 9,864,130 B2
(45) Date of Patent: Jan. 9, 2018

(54) POWER SUPPLY SYSTEM

(71) Applicant: COMPAL BROADBAND NETWORKS INC., Taipei (TW)

(72) Inventors: Hung-Wei Chen, Hsinchu County (TW); Shih-Ting Tseng, Hsinchu County (TW)

(73) Assignee: COMPAL BROADBAND NETWORKS INC., Taipei (TW)

( * ) Notice: Subject to any disclaimer, the term of this patent is extended or adjusted under 35 U.S.C. 154(b) by 160 days.

(21) Appl. No.: 15/049,121

(22) Filed: Feb. 21, 2016

(65) Prior Publication Data

US 2017/0018942 A1   Jan. 19, 2017

Related U.S. Application Data

(60) Provisional application No. 62/193,099, filed on Jul. 16, 2015.

(30) Foreign Application Priority Data

Nov. 19, 2015   (TW) .............................. 104218574 U

(51) Int. Cl.
*H02J 7/00* (2006.01)
*F21V 8/00* (2006.01)
(Continued)

(52) U.S. Cl.
CPC ....... *G02B 6/0096* (2013.01); *H01B 11/1895* (2013.01); *H01H 3/12* (2013.01); *H01R 9/05* (2013.01); *H01R 13/646* (2013.01); *H01R 33/94* (2013.01); *H02J 7/007* (2013.01); *H02J 7/0068* (2013.01); *H02J 9/06* (2013.01); *H02J 9/061* (2013.01); *H02M 3/24* (2013.01); *H05K 1/0203* (2013.01); *H05K 7/186* (2013.01); *H05K 7/20136* (2013.01); *H05K 7/20145* (2013.01); *H05K 7/20172* (2013.01); *H04W 88/08* (2013.01)

(58) Field of Classification Search
None
See application file for complete search history.

(56) References Cited

U.S. PATENT DOCUMENTS 8,716,996 B2   5/2014   Sugawara
9,584,023 B2 *  2/2017   Tseng .................. G02B 6/0096
(Continued)

*Primary Examiner* — Long Nguyen
(74) *Attorney, Agent, or Firm* — Winston Hsu

(57) ABSTRACT

A power supply system includes: a power supply terminal, for receiving first power from an external power source or outputting second power to a load; at least one battery, for receiving and storing first power in a charging mode, and outputting second power to the power supply terminal in a discharging mode; a charger, enabled in the charging mode for charging the battery by first power; a switch, turned on in the discharging mode for transmitting second power to the power supply terminal; a current detection circuit, for detecting a current of the power supply terminal to determine whether the power supply system is operated in the charging or discharging mode. The current detection circuit controls the charger to be enabled in the charging mode and disabled in the discharging mode, and controls the switch to be turned on in the discharging mode and turned off in the charging mode.

10 Claims, 4 Drawing Sheets

(51) Int. Cl.

| | | |
|---|---|---|
| *H01B 11/18* | (2006.01) | |
| *H01H 3/12* | (2006.01) | |
| *H01R 9/05* | (2006.01) | |
| *H01R 13/646* | (2011.01) | |
| *H01R 33/94* | (2006.01) | |
| *H02J 9/06* | (2006.01) | |
| *H02M 3/24* | (2006.01) | |
| *H05K 1/02* | (2006.01) | |
| *H05K 7/18* | (2006.01) | |
| *H05K 7/20* | (2006.01) | |
| *H04W 88/08* | (2009.01) | |

(56) References Cited

U.S. PATENT DOCUMENTS

| | | |
|---|---|---|
| 2009/0174386 A1 | 7/2009 | Popescu |
| 2009/0268488 A1 | 10/2009 | Fujii |
| 2012/0022708 A1* | 1/2012 | Higuchi ................ H02J 7/0031 |
| | | 700/293 |
| 2013/0083562 A1 | 4/2013 | Wu |
| 2015/0160287 A1 | 6/2015 | Huang |
| 2015/0207311 A1 | 7/2015 | Chang |
| 2015/0280585 A1 | 10/2015 | Hayakawa |

\* cited by examiner

POWER SUPPLY SYSTEM

CROSS REFERENCE TO RELATED APPLICATIONS

This application claims the benefit of U.S. Provisional Application No. 62/193,099, filed on Jul. 16, 2015, the contents of which are incorporated herein by reference.

BACKGROUND OF THE INVENTION

1. Field of the Invention

The present invention relates to a power supply system, and more particularly, to a power supply system capable of both charging and discharging functions.

2. Description of the Prior Art

With developments of technology and advancements in the industry, mobile devices such as mobile phones, GPS navigator systems, tablets, laptops and wearable devices have become indispensable in our daily life. In order to facilitate a user to carry, the mobile devices are always equipped with batteries for power storage, which provides the power required during operations. However, the power stored in the batteries is not unlimited, and therefore mobile power banks or portable power supplies which can store more power appear in the market. The user may carry a mobile power bank or portable power supply. When power in the batteries of the mobile device is used up, the mobile device can be connected to the mobile power bank or portable power supply to receive real-time power supply.

In general, a portable power supply should have both charging and discharging functions. Conventionally, the charging and discharging functions are realized on different terminals; that is, the portable power supply may include a power input terminal and a power output terminal, for performing charging and discharging functions, respectively. However, the design of portable electronic devices becomes lighter and smaller, and thus the shell size may also become smaller, such that the number of pins or connection ports which can be deployed on the shell becomes fewer accordingly. Therefore, the new type portable power supplies are required to integrate the power input function and power output function on the same terminal to further achieve reduction of the size. In such a condition, the portable power supplies should possess satisfactory detection performance, in order to accurately determine whether it should be operated in the charging mode or discharging mode.

In the prior art, determination of the charging mode and discharging mode are realized by voltage detection. When an external voltage received by the portable power supply is greater than a specific threshold value, the portable power supply will determine that an external power source exists and thereby switch to the charging mode to receive power. When the external voltage is smaller than the threshold value, the portable power supply will switch to the discharging mode. However, the detected external voltage may be influenced due to various factors such as the impedance in the power supply path or magnitudes of currents drawn from the power source; hence, the voltage may possess irregular fluctuations, which result in wrong determination of the system. Thus, the portable power supply may switch to a wrong operation mode. For example, when the current drawn by the batteries of the portable power supply exceeds a predefined upper limit of the external power source, the input voltage may significantly fall. At this moment, the portable power supply may determine that the external power source does not exist and thereby stop charging or switch to the discharging mode, which results in instability of charging and also reduces the charging efficiency. Thus, there is a need to provide another power supply system, in order to realize more accurate power detection.

SUMMARY OF THE INVENTION

It is therefore an objective of the present invention to provide a power supply system capable of both charging and discharging functions. The power supply system of the present invention may determine whether an external power exists by detecting the current of the power supply terminal, in order to accurately switch to the charging mode or discharging mode.

The present invention discloses a power supply system, which comprises a power supply terminal, at least one battery, a charger, a switch and a current detection circuit. The power supply terminal, coupled to an external power source or a load, is used for receiving first power from the external power source or outputting second power to the load. The at least one battery is used for receiving and storing the first power from the power supply terminal in a charging mode, and outputting the second power to the power supply terminal in a discharging mode. The charger, coupled between the at least one battery and the power supply terminal, is enabled in the charging mode for charging the at least one battery by the first power, and disabled in the discharging mode. The switch, coupled between the at least one battery and the power supply terminal, is turned on in the discharging mode for transmitting the second power to the power supply terminal, and turned off in the charging mode. The current detection circuit, coupled between the charger, the switch and the power supply terminal, is used for detecting a current of the power supply terminal to determine whether the power supply system is operated in the charging mode or the discharging mode, wherein the current detection circuit controls the charger to be enabled in the charging mode and disabled in the discharging mode, and controls the switch to be turned on in the discharging mode and turned off in the charging mode.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
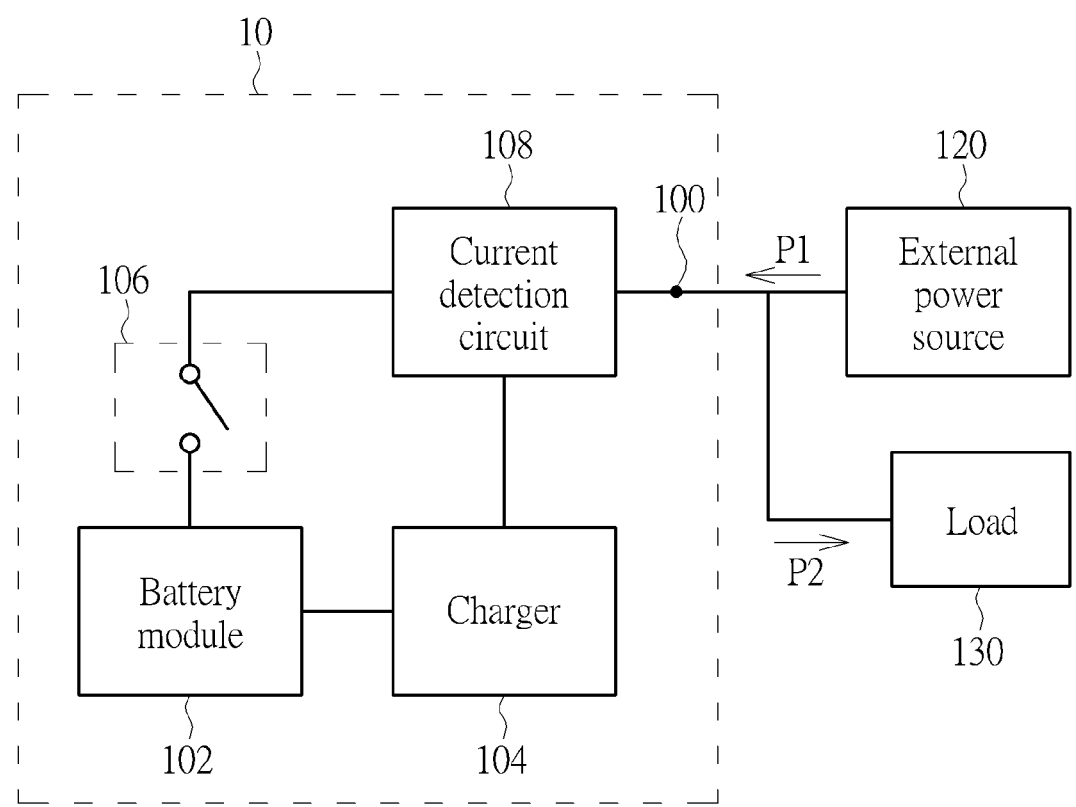
FIG. 1 is a schematic diagram of a power supply system according to an embodiment of the present invention.

Please refer to FIG. 1, which is a schematic diagram of a power supply system 10 according to an embodiment of the present invention. As shown in FIG. 1, the power supply system 10 includes a power supply terminal 100, a battery module 102, a charger 104, a switch 106 and a current detection circuit 108. The power supply terminal 100 may be coupled to an external power source 120 and/or a load 130.

The power supply terminal 100 may receive power P1 from the external power source 120 or output power P2 to the load 130. The battery module 102, which includes at least one battery, may receive and store the power P1 from the power supply terminal 100 in a charging mode, and output the power P2 to the power supply terminal 100 in a discharging mode. The charger 104, coupled between the battery module 102 and the power supply terminal 100, may be enabled in the charging mode for charging the battery(s) in the battery module 102 by the power P1 and disabled in the discharging mode. The switch 106, coupled between the battery module 102 and the power supply terminal 100, may be turned on in the discharging mode for transmitting the power P2 to the power supply terminal 100 and turned off in the charging mode. The current detection circuit 108, coupled between the charger 104, the switch 106 and the power supply terminal 100, is used for detecting a current of the power supply terminal 100 to determine whether the power supply system 10 should be operated in the charging mode or the discharging mode. The current detection circuit 108 may control the charger 104 to be enabled in the charging mode and disabled in the discharging mode, and control the switch 106 to be turned on the discharging mode and turned off in the charging mode.

In detail, in the charging mode, the power supply terminal 100 may be regarded as a power source terminal, which receives the power P1 from the external power source 120. Since the charger 104 is enabled, the power P1 may be transmitted to the battery module 102 via the charger 104, in order to charge the battery(s) in the battery module 102. In the discharging mode, the power supply terminal 100 may be regarded as a power output terminal. Since the switch 106 is turned on, the power P2 may be transmitted to the power supply terminal 100 from the battery(s) in the battery module 102 via the switch 106, in order to supply power to the load 130.

Figure 2:
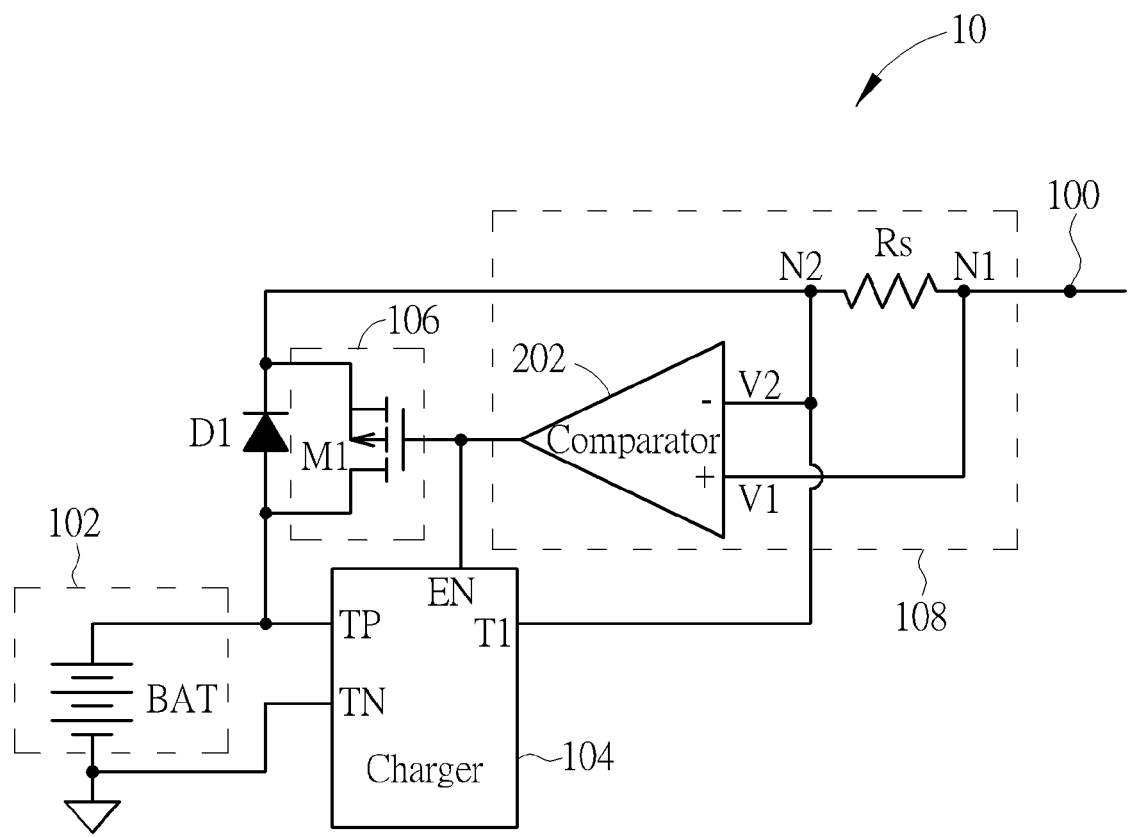
FIG. 2 is a schematic diagram of an implementation of the power supply system shown in FIG. 1.

Please refer to FIG. 2, which is a schematic diagram of an implementation of the power supply system 10. As shown in FIG. 2, the current detection circuit 108 includes a current sensing resistor Rs and a comparator 202. The current sensing resistor Rs, coupled to the power supply terminal 100, is used for generating a voltage difference according to the current of the power supply terminal 100. The comparator 202 then determines whether the power supply system 10 should be operated in the charging mode or the discharging mode according to the voltage difference. In other words, the current sensing resistor Rs is connected to the current path of the power supply terminal 100 in series, so that any current flowing through the power supply terminal 100 may also flow through the current sensing resistor Rs. In such a condition, the current detection circuit 108 may convert the current flowing through the current sensing resistor Rs into the voltage difference between the two terminals of the current sensing resistor Rs, in order to determine the operation mode according to the voltage difference. The battery module 102 may include batteries BAT. The charger 104 includes a power input terminal T1, a control terminal EN, a positive power output terminal TP and a negative power output terminal TN. The power input terminal T1 is used for receiving the power P1. The control terminal EN, coupled to the output terminal of the comparator 202, is used for receiving a control signal or control voltage from the comparator 202. The positive power output terminal TP and the negative power output terminal TN, respectively connected to two terminals of the batteries BAT, are used for charging the batteries BAT. In addition, the switch 106 may include a transistor M1, which has a control terminal coupled to the output terminal of the comparator 202, for receiving a control signal or control voltage from the comparator 202.

In detail, an input terminal of the comparator 202 is connected to a terminal N1 of the current sensing resistor Rs, and another input terminal of the comparator 202 is connected to another terminal N2 of the current sensing resistor Rs. The current of the power supply terminal may generate a voltage V1 on the terminal N1 and generate a voltage V2 on the terminal N2 by flowing through the current sensing resistor Rs. The above voltage difference is equal to the difference of the voltage V1 and the voltage V2. The two input terminals of the comparator 202 may receive the voltage V1 and the voltage V2, respectively, to determine whether the power supply system 10 should be operated in the charging mode or the discharging mode. Furthermore, the output terminal of the comparator 202 is coupled to the charger 104 and the switch 106, allowing the comparator 202 to output the control signals to the charger 104 and the switch 106, in order to control the charger 104 to be enabled or disabled and control the switch 106 to be turned on or off.

Figure 3:
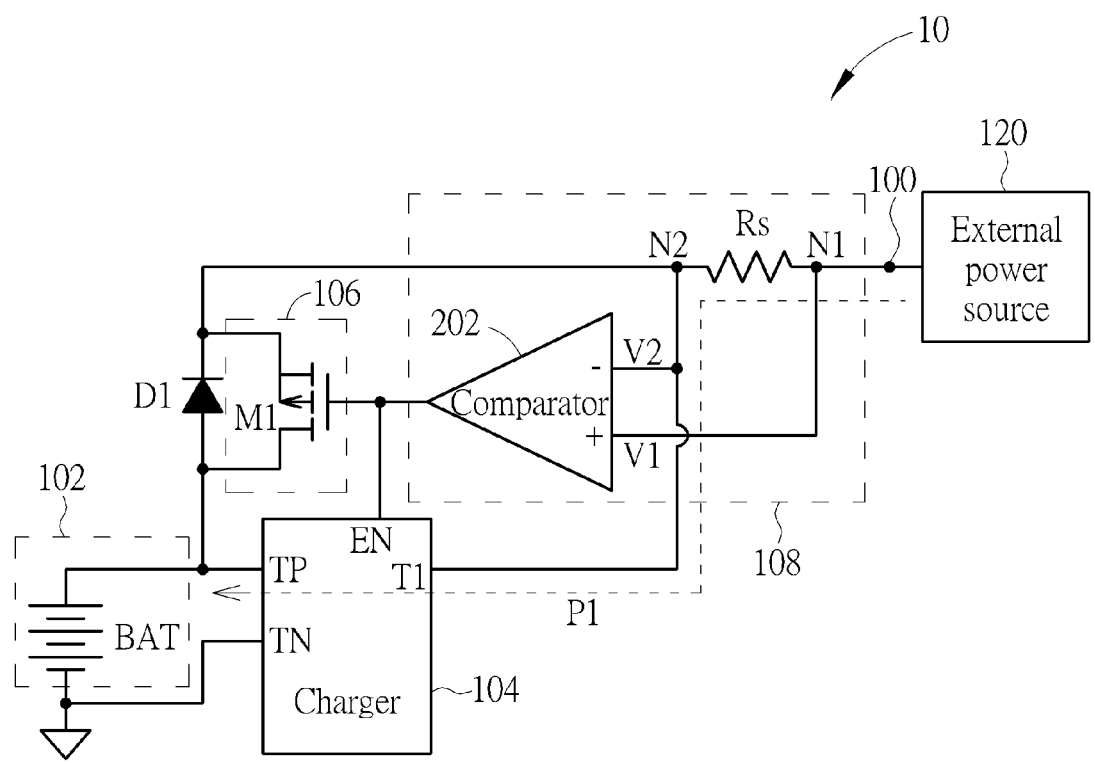
FIG. 3 is a schematic diagram of the power supply system operated in the charging mode.

Please refer to FIG. 3, which is a schematic diagram of the power supply system 10 operated in the charging mode. As shown in FIG. 3, in the charging mode, the power P1 is transmitted to the battery module 102 from the power supply terminal 100 via a charging path. The current sensing resistor Rs of the current detection circuit 108 and the charger 104 are also located in the charging path. Please note that when the external power source 120 exists, the current may flow with the power P1 into the charger 104 and the battery module 102 via the current sensing resistor Rs, so that the voltage V1 on the terminal N1 is greater than the voltage V2 on the terminal N2. When the voltage V1 is greater than the voltage V2, the comparator 202 may determine that the power supply system 10 should be operated in the charging mode, and accordingly output a high voltage level to the control terminal EN of the charger 104, in order to enable the operations of the charger 104. The comparator 202 may also output the high voltage level to the switch 106. Preferably, the transistor M1 of the switch 106 may be a P-type metal oxide semiconductor field-effect transistor (PMOSFET), the gate terminal of which is connected to the output terminal of the comparator 202. At this moment, the gate terminal of the PMOSFET receives the high voltage level, so the switch 106 is turned off; this prevents the battery(s) from discharging at the same time.

Figure 4:
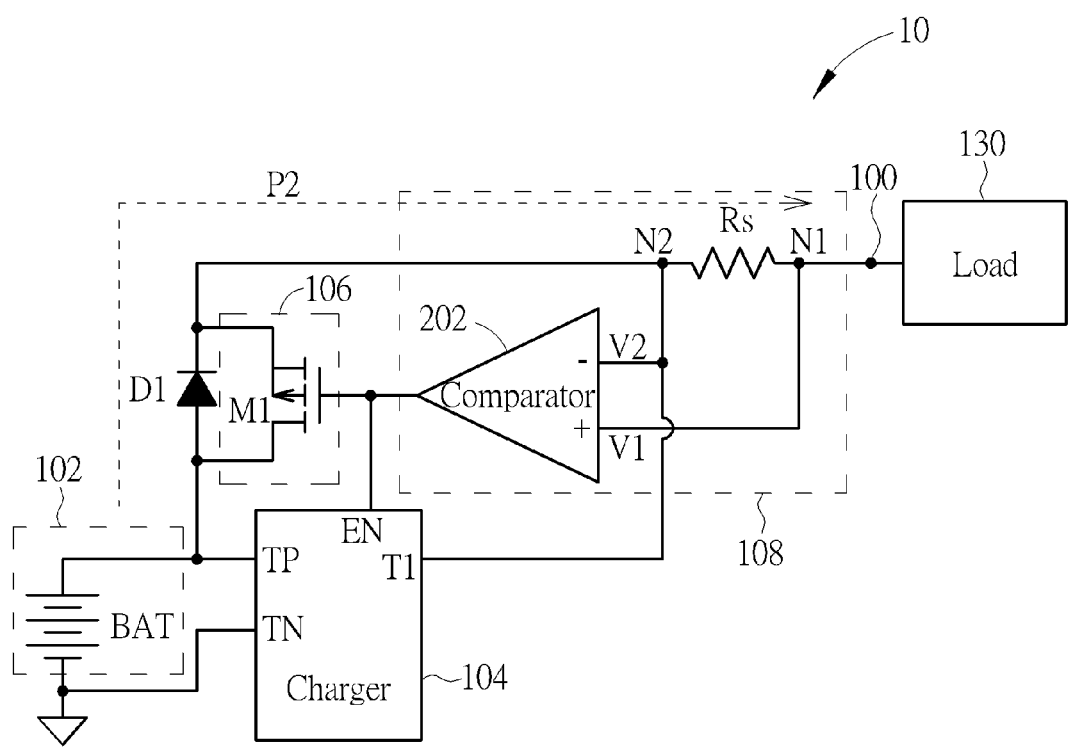
FIG. 4 is a schematic diagram of the power supply system operated in the discharging mode.

Please refer to FIG. 4, which is a schematic diagram of the power supply system 10 operated in the discharging mode. As shown in FIG. 4, in the discharging mode, the power P2 is transmitted to the power supply terminal 100 and the load 130 from the battery module 102 via a discharging path. The current sensing resistor Rs of the current detection circuit 108 and the switch 106 are also located in the discharging path. In addition, the discharging path further includes a diode D1, which is connected with the switch 106 in parallel. When the power supply terminal 100 is connected to the load 130 and detects that the load 130 is drawing currents, the diode D1 may output a detection current to the external load 130 via the current detection circuit 108 before the switch 106 is turned on. In this manner, the current detection circuit 108 detects that the power supply system 10 is operated in the discharging mode, and thereby turns on the switch 106. In detail, when the diode D1 generates the detection current, this detection current may flow to the power supply terminal 100 and the external load 130 via the current sensing resistor Rs, so that the voltage V2 on the terminal N2 may be greater than the voltage V1 on the terminal N1. When the voltage V2 is greater than the voltage V1, the comparator 202 may determine that the power supply system 10 should be operated in the discharging mode, and accordingly output a low voltage level to the control terminal of the transistor M1 (which is PMOSFET), in order to turn on the switch 106. The comparator 202 may also output the low voltage level to the control terminal EN of the charger 104 to disable the operations of the charger 104; this prevents the charger 104 from performing charging functions at the same time.

Please note that the disposition of the diode D1 aims at providing the detection current, while practical power supply operations still need to be performed after the switch 106 is turned on. According to the characteristics of the diode, the current flowing through the diode may generate a voltage drop substantially equal to 0.5-0.7 volt, such that the load 130 may not obtain an enough input voltage. Therefore, when the current detection circuit 108 detects the detection current of the diode D1, the switch 106 will be turned on. The switch 106 can be fully turned on and the corresponding voltage drop is far lower than the voltage drop generated by the diode D1, so that the load 130 can obtain an enough input voltage.

The power supply system and related current detection circuit of the present invention may realize accurate operation mode determination. In contrast to the method of determining the charging or discharging mode by using voltage detection in the prior art which is easily influenced by voltage fluctuations and thus results in wrong determination, the present invention performs the determination via current detection instead. Current detection is harder to be influenced by voltage fluctuations. This is because the current should flow toward the battery during the power input process no matter how the input voltage fluctuates. In such a condition, the current direction flowing through both terminals of the current sensing resistor may not change, and thus the comparator may accurately determine to be the charging mode. On the other hand, when an external load draws a current, the current should flow toward the power supply terminal from the battery. In such a condition, the current direction flowing through both terminals of the current sensing resistor may not change, and thus the comparator may accurately determine to be the discharging mode.

Please note that the present invention may determine whether an external power source exists by detecting the current of the power supply terminal, in order to accurately switch the power supply system to the charging mode or the discharging mode. Those skilled in the art can make modifications and alternations accordingly. For example, the power supply system of the present invention may be a power bank, a portable power supply or any other power supply system or device capable of realizing charging and discharging functions on the same power supply terminal. In addition, the structure of the current detection circuit shown in FIG. 2 is only one of various possible implementations of the present invention, and those skilled in the art may also apply other methods to perform current detection, which is not limited herein. Further, since the current sensing resistor used for current detection always needs to be connected to the power supply terminal in series to pass the current, the current sensing resistor preferably has a smaller resistance value, in order to prevent the charging or discharging operations from generating a large loss which reduces power supply efficiency.

The battery module may include multiple batteries connected in series, as shown in FIG. 2. In another embodiment, the battery module may include only one battery. On the other hand, in the above embodiment, PMOSFET is utilized to realize the transistor M1 in the switch 106, but in another embodiment, N-type metal oxide semiconductor field-effect transistor (NMOSFET) may be applied to achieve a lower power loss. In this case, the control terminal of this transistor may be coupled to an inverter, or the two input terminals of the comparator may be inversely connected, in order to accurately turn on the transistor in the discharging mode.

To sum up, the present invention provides a power supply system capable of both charging and discharging functions, where the charging and discharging functions may be realized on the same power supply terminal. In the power supply system of the embodiments of the present invention, the current detection circuit is used for detecting the current of the power supply terminal to determine whether the power supply system should be operated in the charging mode or the discharging mode. Since the current direction is hard to be influenced by voltage fluctuations, the operation mode determination performed by the current detection circuit may achieve high accuracy, in order to realize accurate operation mode switching.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A power supply system, comprising:
   a power supply terminal, coupled to an external power source or a load, for receiving first power from the external power source or outputting second power to the load;
   at least one battery, for receiving and storing the first power from the power supply terminal in a charging mode, and outputting the second power to the power supply terminal in a discharging mode;
   a charger, coupled between the at least one battery and the power supply terminal, enabled in the charging mode for charging the at least one battery by the first power, and disabled in the discharging mode;
   a switch, coupled between the at least one battery and the power supply terminal, turned on in the discharging mode for transmitting the second power to the power supply terminal, and turned off in the charging mode; and
   a current detection circuit, coupled between the charger, the switch and the power supply terminal, for detecting a current of the power supply terminal to determine whether the power supply system is operated in the charging mode or the discharging mode, wherein the current detection circuit controls the charger to be enabled in the charging mode and disabled in the discharging mode, and controls the switch to be turned on in the discharging mode and turned off in the charging mode.

2. The power supply system of claim 1, wherein the charger is located in a charging path of the power supply system and the switch is located in a discharging path of the power supply system.

3. The power supply system of claim 2, wherein the discharging path further comprises a diode, which is connected with the switch in parallel, for outputting a detection current to the current detection circuit before the switch is turned on.

4. The power supply system of claim 1, wherein the current detection circuit comprises:

a current sensing resistor, coupled to the power supply terminal, for generating a voltage difference according to the current of the power supply terminal; and a comparator, coupled to the current sensing resistor, for determining whether the power supply system is operated in the charging mode or the discharging mode according to the voltage difference.

5. The power supply system of claim 4, wherein the current of the power supply terminal flows through the current sensing resistor, to generate a first voltage on a first terminal of the current sensing resistor and generate a second voltage on a second terminal of the current sensing resistor.

6. The power supply system of claim 5, wherein the voltage difference is a difference of the first voltage and the second voltage.

7. The power supply system of claim 5, wherein the comparator comprises:

a first input terminal, coupled to the first terminal of the current sensing resistor, for receiving the first voltage;

a second input terminal, coupled to the second terminal of the current sensing resistor, for receiving the second voltage; and an output terminal, coupled to the charger and the switch, for controlling the charger to be enabled or disabled and controlling the switch to be turned on or off according to magnitudes of the first voltage and the second voltage.

8. The power supply system of claim 5, wherein the comparator determines that the power supply system is operated in the charging mode and controls the charger to be enabled and the switch to be turned off when the first voltage is greater than the second voltage.

9. The power supply system of claim 5, wherein the comparator determines that the power supply system is operated in the discharging mode and controls the charger to be disabled and the switch to be turned on when the second voltage is greater than the first voltage.

10. The power supply system of claim 1, wherein the switch comprises a P-type metal oxide semiconductor field-effect transistor.

* * * * *